(12) United States Patent
Black et al.

(10) Patent No.: US 7,726,008 B2
(45) Date of Patent: Jun. 1, 2010

(54) METHOD OF FORMING A MAGNETIC-FIELD SENSOR HAVING MAGNETIC NANOPARTICLES

(75) Inventors: Charles T. Black, White Plains, NY (US); Stephen M. Gates, Ossining, NY (US); Christopher B. Murray, Ossining, NY (US); Robert L. Sandstrom, Chestnut Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 706 days.

(21) Appl. No.: 11/030,787

(22) Filed: Jan. 7, 2005

(65) Prior Publication Data

US 2005/0152073 A1 Jul. 14, 2005

Related U.S. Application Data

(62) Division of application No. 10/073,755, filed on Feb. 11, 2002, now Pat. No. 6,897,650.

(51) Int. Cl.
*G01R 33/09* (2006.01)
(52) U.S. Cl. .................. 29/603.07; 29/604; 29/846; 427/130; 427/131; 427/132; 427/199; 427/205; 427/548; 427/550; 365/158; 365/171
(58) Field of Classification Search ............... 29/602.1, 29/595, 603.07, 604, 846, 831; 427/548, 427/550, 97.1, 97.3, 97.4, 123, 125, 130, 427/131, 132, 97, 199, 202, 205; 336/200, 336/223; 324/252, 250, 207.21; 428/113, 428/298.1, 328, 329, 333, 323, 336; 360/324, 360/324.2; 365/158, 171

See application file for complete search history.

(56) References Cited

U.S. PATENT DOCUMENTS 3,180,835 A    4/1965  Peri (Continued)

FOREIGN PATENT DOCUMENTS

EP    0 113 281 A1    7/1984

(Continued)

OTHER PUBLICATIONS

K. Nakajima, et al., "Magnetoresistance Oscillations in Double Ferromagnetic Tunnel Junctions with Layered Ferromagnetic Nanoparticles", IEEE Transactions on Magnetics, vol. 36, No. 5, 2000, pp. 2806-2808.

(Continued)

*Primary Examiner*—A. Dexter Tugbang
*Assistant Examiner*—Livius R Cazan
(74) *Attorney, Agent, or Firm*—Gibb I.P. Law Firm, LLC

(57) ABSTRACT

A magnetic-field sensor device comprises at least two electrodes; an insulating layer separating the at least two electrodes; at least one layer of chemically-synthesized magnetic nanoparticles disposed at or above a level with the insulating layer, and disposed between the at least two electrodes; and an organic spacer surrounding each of the chemically-synthesized magnetic nanoparticles. A deviation between diameters of different ones of the nanoparticles is less than 15%. Moreover, the chemically-synthesized magnetic nanoparticles range in size between 2 nm and 20 nm in diameter.

16 Claims, 7 Drawing Sheets

U.S. PATENT DOCUMENTS

| | | | |
|---|---|---|---|
| 3,531,413 A | 9/1970 | Rosenweig | |
| 3,814,696 A | 6/1974 | Verdone et al. | |
| 3,965,046 A | 6/1976 | Deffeyes | |
| 4,006,047 A | 2/1977 | Brummett et al. | |
| 4,063,000 A | 12/1977 | Aonuma et al. | |
| 4,687,596 A | 8/1987 | Borduz et al. | |
| 4,728,591 A | 3/1988 | Clark et al. | |
| 4,877,647 A | 10/1989 | Klabunde | |
| 4,940,596 A | 7/1990 | Wright | |
| 5,147,841 A | 9/1992 | Wilcoxon | |
| 5,160,452 A | 11/1992 | Marutsuka et al. | |
| 5,240,493 A | 8/1993 | Zhen et al. | |
| 5,304,382 A | 4/1994 | Monzyk | |
| 5,491,219 A | 2/1996 | Mann | |
| 5,505,996 A | 4/1996 | Nagayama | |
| 5,580,492 A | 12/1996 | Bonnemann et al. | |
| 5,698,483 A | 12/1997 | Ong et al. | |
| 5,766,764 A | 6/1998 | Olli et al. | |
| 5,824,409 A | 10/1998 | Sellmyer et al. | |
| 5,843,569 A | 12/1998 | Kaitsu et al. | |
| 5,914,361 A | 6/1999 | Inui et al. | |
| 6,162,532 A | 12/2000 | Black et al. | |
| 6,232,777 B1 * | 5/2001 | Sato et al. | 324/252 |
| 6,262,129 B1 | 7/2001 | Murray et al. | |
| 6,730,395 B2 * | 5/2004 | Covington | 428/811.1 |
| 6,740,925 B2 * | 5/2004 | Yoo et al. | 257/314 |
| 2001/0013776 A1 * | 8/2001 | Coehoorn et al. | 324/252 |

FOREIGN PATENT DOCUMENTS

| | | |
|---|---|---|
| EP | 0 460 714 A2 | 12/1991 |
| EP | 0 686 448 A2 | 12/1995 |
| EP | 0 977 212 A2 | 2/2000 |
| WO | WO 9526547 A2 * | 10/1995 |
| WO | WO 98/22942 | 5/1998 |

OTHER PUBLICATIONS

Inomata et al., "Spin-Dependent Tunneling Through Layered Ferromagnetic Nanoparticles", Applied Physics Letters, vol. 73, No. 8, Aug. 24, 1998, pp. 1143-1145.

* cited by examiner

METHOD OF FORMING A MAGNETIC-FIELD SENSOR HAVING MAGNETIC NANOPARTICLES

CROSS-REFERENCE TO RELATED APPLICATIONS

This application is a division of U.S. application Ser. No. 10/073,755 filed Feb. 11, 2002, now U.S. Pat. No. 6,897,650.

BACKGROUND OF THE INVENTION

1. Field of the Invention

The present invention generally relates to magnetic disc drives, and more particularly to magnetic-field sensor devices comprising magnetic nanoparticles.

2. Description of the Related Art

Read-heads for magnetic disc drives currently sense magnetic bits by using an effect known as giant magnetoresistance (GMR). In essence, this type of sensor works because its resistance changes depending on the presence or absence of a magnetic field. The spatial resolution of such a device is limited by the dimensions of the active element in the sensor, which is currently defined lithographically. The GMR effect is described below.

One type of system which exhibits GMR is a magnetic tunnel junction. A magnetic tunnel junction is typically composed of two magnetic thin-film electrodes separated by a thin insulating layer. This insulating layer is sufficiently thin (~5 nm or less) to allow electrons from one of the electrodes to move to the other electrode via quantum mechanical tunneling. Important to the operation of the junction is that the tunneling process preserve the spin of tunneling electrons.

For the case of two magnetic electrodes composed of identical materials, the tunneling conductance (G) for electrons to move through the junction is proportional to:

$$G \sim 1 + P^2 \cos\theta$$

where P is the conduction electron polarization in the magnet (which is a measure of how magnetic the material is), and $\theta$ is the relative angle between electrode magnetic moments. The resistance of the junction is the inverse of its conductance.

If the magnetic moment of one electrode is flipped relative to the other electrode, then the tunneling rate through the junction changes. This resistance change, caused by a change in a magnetic moment orientation, can be used to sense magnetic fields in the manner shown in FIGS. 1(a) and 1(b). The sensor 1 is positioned in close proximity to a magnetic field source 2. The sensor is made of a short length of magnetic material 3 sandwiched between two magnetic electrodes 4 and 5. The magnetic material used to sense the magnetic field 2 is electrically isolated from the two electrodes 4 and 5 by insulating tunnel barriers 6 and 7. Additionally, the material 3 is chosen so that its magnetic moment changes orientation at fields below that of the two electrodes 4 and 5.

In operation, an electric current 8 is made to flow through the device. Initially, the magnetic moments of the sensor material 3 and electrodes 4 and 5 are parallel. When the sensor comes into close proximity with a magnetic field of sufficient strength, the moment of material 3 is flipped relative to the two electrodes 4 and 5 leading to a measurable change in the current through the device 8. The spatial resolution of such a sensor is directly related to the size of the sensor element 3. However, there is a need to improve the spatial resolution of such a magnetic field sensor, particularly in the area of read-heads for magnetic disc drives. Continually increasing storage densities demand the improved resolution.

SUMMARY OF THE INVENTION

In view of the foregoing and other problems, disadvantages, and drawbacks of the conventional magnetic sensor devices, the present invention has been devised, and it is an object of the present invention, to provide a structure and method for improving the spatial resolution of a magnetic-field sensor device.

In order to attain the object suggested above, there is provided, according to one aspect of the invention, a structure and method for forming a magnetic-field sensor device that comprises first depositing a first electrode onto a substrate. Then, an electrically insulating layer is deposited on the first electrode. Next, a portion of the electrically insulating layer is removed to expose a region of the first electrode, thereby creating an empty space. After this, at least one layer of chemically-synthesized nanoparticles is deposited on the electrically insulating layer and within the empty space created by the removal of a portion of the electrically insulating layer.

Upon completion of this step, a second electrode is deposited on both the layer of chemically-synthesized nanoparticles and the electrically insulating layer. Alternatively, multiple layers of nanoparticles may be deposited, or only a single nanoparticle may be deposited, depending on the desired application. The substrate is formed of conducting or non-conducting material, and the first and second electrodes are formed of electrically conducting and magnetic or non-magnetic material. Additionally, a metallic layer of magnetic material may be deposited on the substrate prior to the first electrode being deposited thereon. Alternatively, the magnetic-field sensor device may be formed by first depositing a first electrode onto a substrate. Then, an electrically insulating layer is deposited on the first electrode.

Next, a second electrode is deposited on the electrically insulating layer. After this, a portion of the electrically insulating layer is removed, thereby creating an empty space. Upon completion of this step, at least one layer of chemically-synthesized nanoparticles is deposited in the empty space; and finally, the substrate is removed. Again, multiple layers of nanoparticles may be deposited, or only a single nanoparticle may be deposited, depending on the desired application.

The inventive structure (sensor) has several advantages over conventional devices. First, the critical dimension is about 5 to 50 nm and is well-matched to the bit area required for storage at areal densities >100 Gbit/in². Second, the critical dimension is 5 to 50 nm and is beyond the resolution of current lithographic methods, and is controlled through chemical size separation methods (not through deposition thickness control, and not through lithography). Also, the methods described herein are readily scaled to a large scale production, and the methods use less vacuum-based process equipment than the conventional devices and, hence, the present methods result in lower fabrication costs.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 3(i) is a flow diagram illustrating a preferred method of the invention as described in FIGS. 3(a) through 3(h);

DETAILED DESCRIPTION OF PREFERRED EMBODIMENTS OF THE INVENTION

Figure 1B:
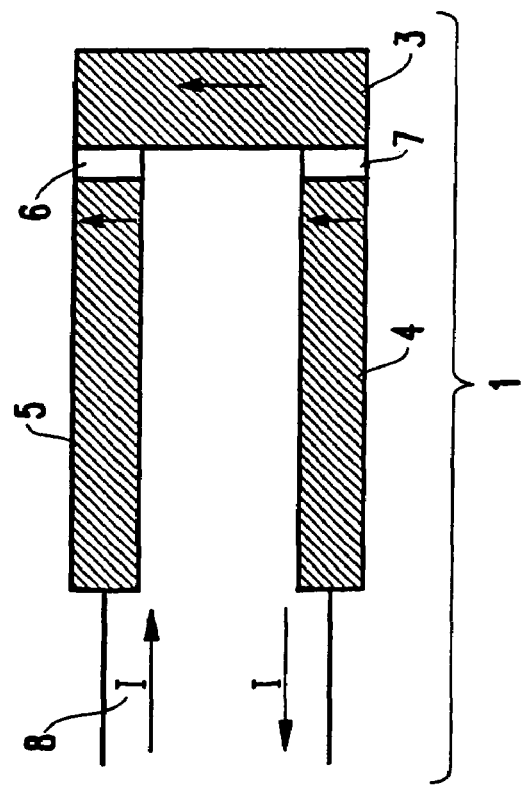
FIG. 1(b) is a schematic diagram of a magnetic object and the magnetic field it produces.
Figure 1A:
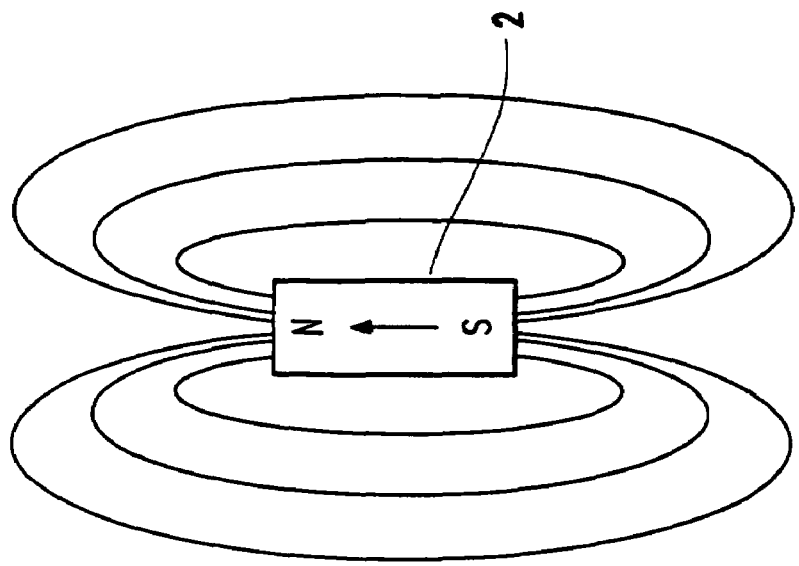
FIG. 1(a) is a schematic diagram of a conventional magnetic-field sensor device.
Figure 2A:
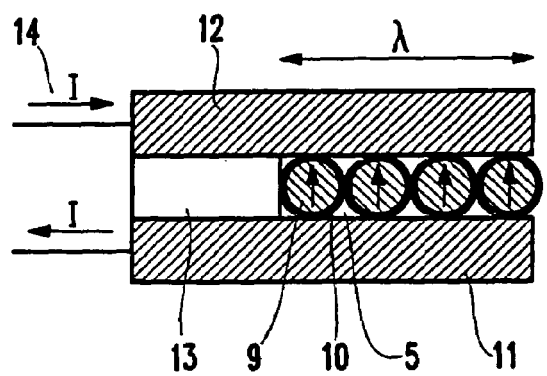
FIG. 2(a) is a side view schematic diagram of a magnetic-field sensor device according to the present invention.
Figure 2B:
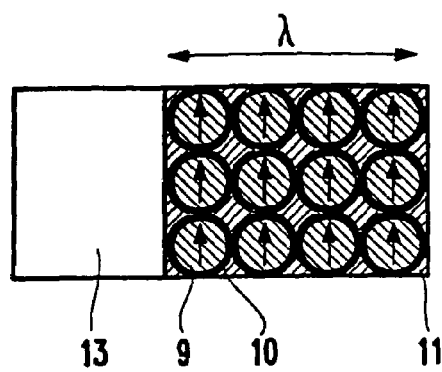
FIG. 2(b) is a top view schematic diagram of a magnetic-field sensor device according to the present invention.
Figure 2C:
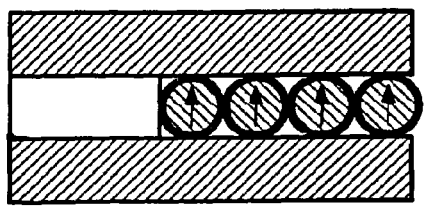
FIG. 2(c) is a side view schematic diagram of a magnetic-field sensor device according to the present invention.
Figure 2D:
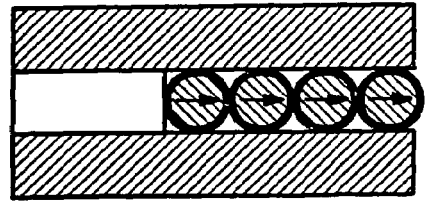
FIG. 2(d) is a side view schematic diagram of a magnetic-field sensor device according to the present invention.

As mentioned, there is a need for improving the spatial resolution of magnetic-field sensor devices. The present invention discloses a magnetic-field sensor device based on electron tunneling through chemically-synthesized magnetic nanoparticles (or nanocrystals). Such nanoparticles are made with extreme uniformity (standard deviations in diameter of <10%, and optimally <5%) with nanometer-scale dimensions (diameters from 2-20 nm). Details of the synthesis of such magnetic nanoparticles have been disclosed previously (U.S. Pat. No. 6,162,532), the complete disclosure of which is herein incorporated by reference.

Nanoparticles with diameters ranging from 2 nm to 20 nm can be made out of a wide variety of organic and inorganic materials (C. B. Murray, D. J. Norris, M. G. Bawendi, *J. Am. Chem. Soc.*, 115, 8706 (1993), L. Brus in "Materials Chemistry: An Energy Discipline," G. A. Ozin, 335 (ACS Sympos. Ser. No. 245, 1995)). Nanoparticles are a subclass of nanoparticles composed of well-characterized, crystalline cores and thin organic coats. Nanoparticles are monodisperse in terms of their size, internal structure (lattice), surface chemistry, and shape. Nanoparticles dispersed in liquids and nanoparticles deposited on solid substrates have provided much information on the submicroscopic properties of materials (A. P. Alivisatos, *Science* 271, 933 (1996)). Sensors employing such nanoparticles as their active elements have improved spatial resolutions because the nanoparticles have dimensions which are smaller and can be defined lithographically. The sensor devices disclosed herein operate using the giant magnetoresistance effect, which has been previously described.

In order to improve the spatial resolution of such a magnetic sensor device, conventional devices are constructed using chemically-synthesized magnetic nanoparticles. The structure and composition of nanoparticles are fully discussed in U.S. Pat. No. 6,162,532. These nanoparticles can be synthesized of different magnetic materials and have precisely-controlled sizes ranging from as small as approximately 2 nm up to approximately 20 nm, depending on the application. The nanoparticle diameters can be controlled to standard deviations less than 15%, and preferably less than 10%. Optimally, the present invention controls nanoparticle diameters to standard deviations within less than 5%.

In order to do this, the present invention comprises sensors made using magnetic nanoparticles synthesized via the means of U.S. Pat. No. 6,162,532. As such, the size distributions of the nanoparticles can be narrowly defined, for example, <15%, <10%, <5%. The nanoparticles preferably comprise magnetic materials such as Co, Fe, Ni, Mn, Cr, Nd, Pr, Pt, Pd, Ho, Gd, Eu, Er, Re, Rh, an intermetallic compound of these elements, a binary alloy of these elements, a ternary alloy of these elements, an oxide of Fe, Co, Ni, Mn, or Cr, and a mixed oxide combining at least one of Fe, Co, Ni, Mn, or Cr, with at least one of La, Sr, Ba, or Cu.

Referring now to the drawings, and more particularly to FIGS. 2(a) through 5(b), there are shown preferred embodiments of the method and structures according to the present invention. In FIGS. 2(a) through 2(d), a first embodiment of the present invention is shown. Specifically, in FIG. 2(a), which shows the side view, and FIG. 2(b), which shows the top view, two magnetic electrodes 11 and 12 are separated from each other by an electrically-insulating layer 13, except for a small area 5 (of length λ) near the ends of the electrodes. A layer of chemically-synthesized nanoparticles 9 is disposed in the small area 5. Each nanoparticle 9 has a magnetic moment. Furthermore, these nanoparticles 9 are electrically-isolated from the electrodes 11 and 12 and from each other by an organic spacer 10 which acts as a tunnel barrier for electrons. This layer of nanoparticles 9 may be a single sheet (as shown) or may also be several nanoparticle layers thick.

In addition, it is possible to control the nanoparticle magnetic moment orientation during deposition of the nanoparticle film, for example, by depositing the nanoparticles 9 while applying an external magnetic field. Depending on the application, the nanoparticle moments may be oriented in the two directions (denoted by the arrows) shown in FIG. 2(c) as parallel (for sensing longitudinal fields) or in FIG. 2(d) as perpendicular (to sense perpendicular fields) to the surface above which the sensor will be used.

The device operation is similar to that described above. A current (I) 14 is applied to flow though the device. Electrons travel from one electrode to the other only by tunneling through the organic spacers 10 and onto the individual nanoparticles 9. The device resistance depends on the relative orientations of the electrode magnetic moments to the nanoparticle magnetic moments. Through choice of nanoparticle and electrode materials, the nanoparticle moments are made to flip at a lower magnetic field than that required to flip the electrode moments. Thus, a magnetic field sensor is created whose spatial resolution is set by the nanometer size-scale of the chemically-synthesized nanoparticles, thereby increasing the overall spatial resolution.

There are several different possible embodiments of such a device, each of which are described herein. First, as previously described, two magnetic electrodes 11, 12 are separated by an insulating layer 13. In the empty space 5 near the end of the sensor, there is deposited a single layer of chemically-synthesized magnetic nanoparticles 9. The nanoparticles range in sizes (diameters) from approximately 2 nm up to approximately 20 nm. Second, the same device as described in the first embodiment above is disclosed, except that the nanoparticles 9 are deposited with a preferred magnetic-moment orientation that is parallel to the direction of current flow through the nanoparticles 9 (see FIG. 2(c)). Third, the same device as described in the first embodiment above is disclosed, except that the nanoparticles 9 are deposited with a preferred magnetic-moment orientation that is perpendicular to the direction of current flow through the nanoparticles 9 (see FIG. 2(d)). Fourth, the same devices as described in the first, second, and third embodiments above are disclosed, except that only one of the two electrodes 11, 12 is magnetic. The other device(s) can be any non-magnetic metal or semiconductor. Fifth, the same device as described in the first embodiment above is disclosed wherein the two magnetic electrodes 11, 12 are separated by an insulating layer 13. In the first embodiment, in the empty space 5 near the end of the sensor, there is deposited a layer of chemically-synthesized magnetic nanoparticles 9. However, in this fifth embodiment, the layer of nanoparticles 9 is more than one layer thick. Sixth, the same device as described in the fifth embodiment above is disclosed, except that the nanoparticles 9 are deposited with a preferred magnetic-moment orientation that is parallel to the direction of current flow through the nanoparticles 9. Seventh, the same device as described in the fifth embodiment above is disclosed, except that the nanoparticles 9 are deposited with a preferred magnetic-moment orientation that is perpendicular to the direction of current flow through the nanoparticles 9. Eighth, the same device as described in the fifth embodiment above is disclosed, expect that only one of the two electrodes 11, 12 is magnetic. The other electrode can be any non-magnetic metal or semiconductor. Ninth, the same device as described in the fifth embodiment above is disclosed, except that neither electrode 11, 12 is magnetic. The electrodes 11, 12 may be any non-magnetic metal or semiconductor. Tenth, the same devices as described in the first through the ninth embodiments are disclosed, except that the space 5 near the end of the sensor is not completely filled with a layer of chemically-synthesized nanoparticles 9. Eleventh, the same devices as described in the first through the ninth embodiments are disclosed, except that the empty space 5 near the end of the sensor ($\lambda$) is made only wide enough to fit a single chemically-synthesized nanoparticle 9. Twelfth, the same devices as described in the first through the eleventh embodiments are disclosed, except that the width of the device is the same as the width of a single, chemically-synthesized nanoparticle 9.

Any and all of the above embodiments and the structures described therein may be fabricated in several different ways. The first such method is illustrated in FIGS. 3(a) through 3(i). Each of the structural components are also shown in FIGS. 3(a) through 3(h). Furthermore, the entire process is shown in a flowchart in FIG. 3(i).

Figure 3A:
FIG. 3(a) is a side view schematic diagram of a magnetic-field sensor device according to the present invention.

First, as shown in FIG. 3(a), the process begins 30 with a substrate 15. The substrate can be any flat surface, and may be conducting or non-conducting. Preferably, this substrate is composed of silicon, silicon dioxide, silicon nitride, glass, or ceramic material.

Figure 3B:
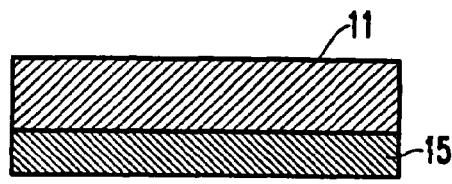
FIG. 3(b) is a side view schematic diagram of a magnetic-field sensor device according to the present invention.

Next, as shown in FIG. 3(b), a bottom metallic layer (electrode) 11 is deposited 32 onto the substrate 15. This layer is composed of a soft magnetic material and is typically between 10 and 30 nm thick. Preferably, the electrode material is composed of permalloy NiFe or NiFeCo. This bottom electrode layer may or may not have an antiferromagnetic underlayer (typically between 10-30 nm thick) used to pin the magnetization of the bottom electrode. Antiferromagnetic layers are typically composed of MnFe, CoO, NiFeTh, NiO, or a synthetic antiferromagnet composed of two magnetic layers separated by a thin Ru layer.

Figure 3C:
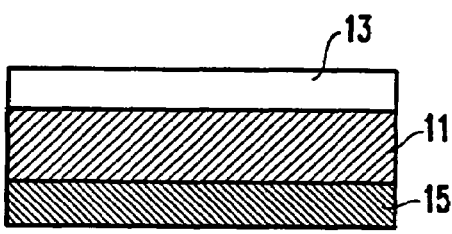
FIG. 3(c) is a side view schematic diagram of a magnetic-field sensor device according to the present invention.

The bottom electrode 11 is deposited 32 onto the substrate 15, as illustrated in FIG. 3(b). This electrode 11 is electrically conducting and may be magnetic or non-magnetic, depending on choice of device type, as previously indicated above. FIG. 3(c) then shows an electrically insulating layer 13 being deposited or grown 33 on top of the bottom electrode 15.

Figure 3D:
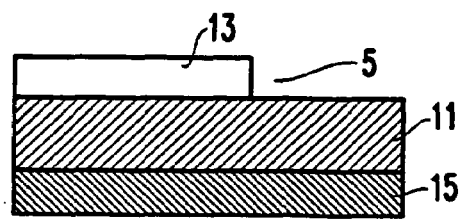
FIG. 3(d) is a side view schematic diagram of a magnetic-field sensor device according to the present invention.
Figure 3E:
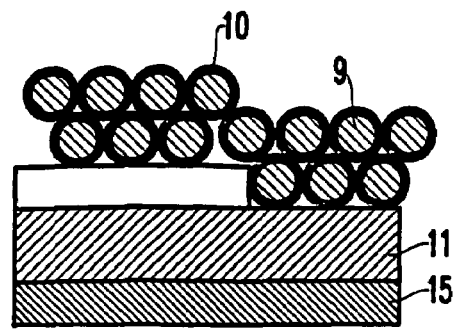
FIG. 3(e) is a side view schematic diagram of a magnetic-field sensor device according to the present invention.
Figure 3F:
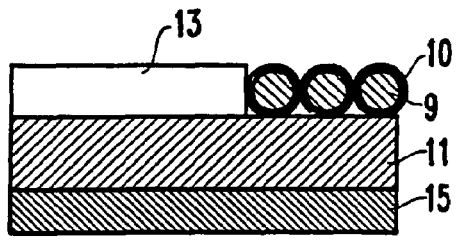
FIG. 3(f) is a side view schematic diagram of a magnetic-field sensor device according to the present invention.

After this, a region of the insulating layer 13 is patterned 34 and etched 35, thereby forming an empty space 5, and exposing a region of the bottom electrode 11, which is shown in FIG. 3(d). Next, as depicted in FIG. 3(e), a layer of nanoparticles 9 is deposited 36 onto the structure, covering both the exposed bottom electrode 11 and insulating layer 13. The nanoparticles 9 may be separated from each other by an insulating organic layer 10. The nanoparticle layer 9 may be either one or several layers thick, depending on the type of device being fabricated. As such, nanoparticles 9 may or may not be removed 37 from the insulating spacer layer 13, once again, depending on whether one or several layers of nanoparticles 9 are desired. FIG. 3(f) shows only a single layer of nanoparticles 9 left in the empty space 5.

Figure 3G:
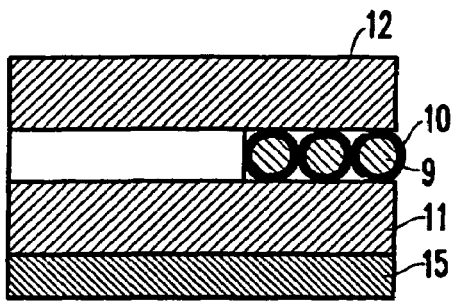
FIG. 3(g) is a side view schematic diagram of a magnetic-field sensor device according to the present invention.
Figure 3H:
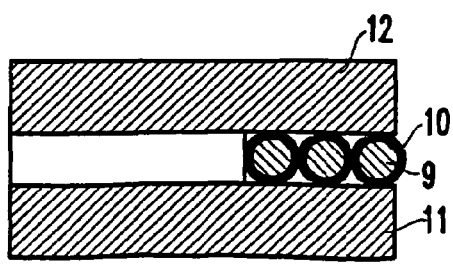
FIG. 3(h) is a side view schematic diagram of a magnetic-field sensor device according to the present invention.
Figure 31:
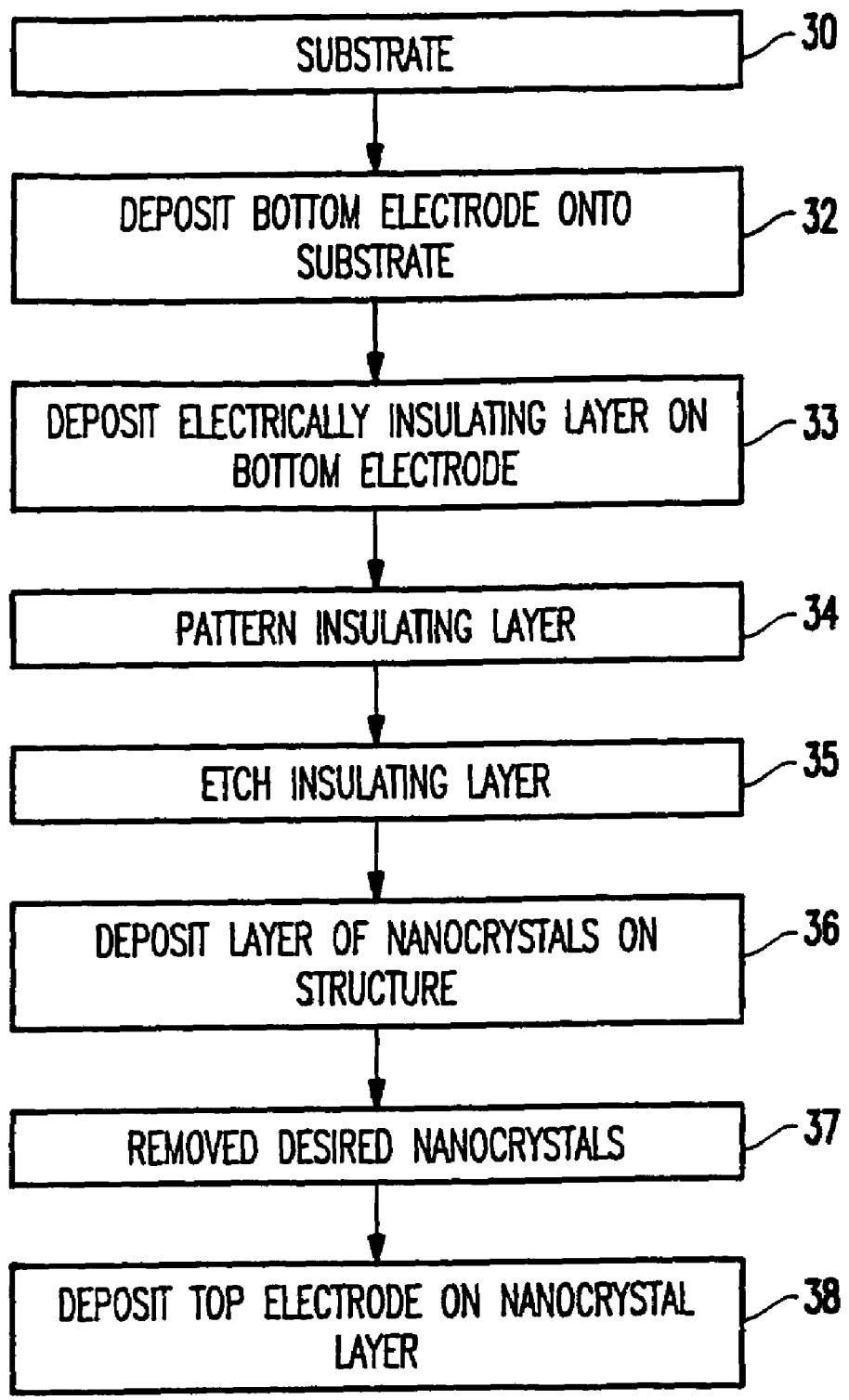

Upon completion of this step, a top electrode 12 is deposited 38 on top of the nanoparticle layer 9 and the insulating layer 13, as shown in FIG. 3(g). The top electrode 12 is electrically conducting and may or may not be magnetic, depending on the type of device being fabricated. FIG. 3(h) shows the device with the substrate 15 removed.

An alternative method is illustrated in FIGS. 4(a) through 4(h). Each of the structural components are also shown in FIGS. 4(a) through 4(g). Furthermore, the entire process is shown in a flowchart in FIG. 4(h).

Figure 4A:
FIG. 4(a) is a side view schematic diagram of an alternate embodiment of a magnetic-field sensor device according to the present invention.

As with the previous embodiment and as shown in FIG. 4(a), the process begins 40 with a flat substrate 15. The substrate can be any flat surface and may be conducting or non-conducting. Preferably, this substrate is composed of silicon, silicon dioxide, silicon nitride, glass, GaAs, sapphire ($Al_2O_3$) or ceramic material. The bottom metallic layer 11 is also called the bottom electrode layer 11. The bottom electrode layer is shown in FIGS. 3(b) and 4(b).

Figure 4B:
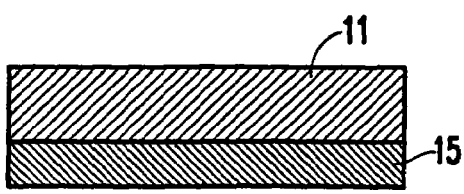
FIG. 4(b) is a side view schematic diagram of an alternate embodiment of a magnetic-field sensor device according to the present invention.
Figure 4C:
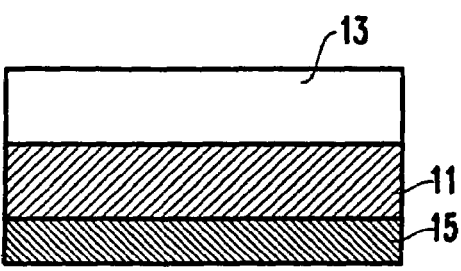
FIG. 4(c) is a side view schematic diagram of an alternate embodiment of a magnetic-field sensor device according to the present invention.

Next, as shown in FIG. 4(b), a bottom electrode 11 is deposited 42 onto the substrate 15. This electrode 11 is electrically conducting and can be magnetic or non-magnetic, depending on the choice of the device type as previously indicated above. Upon completion of this step, an electrically insulating layer 13 is deposited or grown 43 on top of the bottom electrode 11. This is illustrated in FIG. 4(c). The thickness of the insulating layer 13 is at least as large as a nanoparticle diameter which ranges from approximately 2 nm to approximately 20 nm in diameter.

Figure 4D:
FIG. 4(d) is a side view schematic diagram of an alternate embodiment of a magnetic-field sensor device according to the present invention.
Figure 4E:
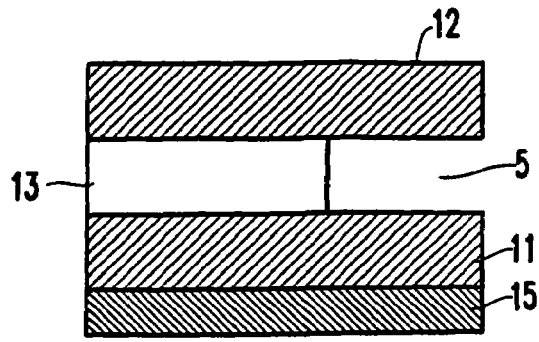
FIG. 4(e) is a side view schematic diagram of an alternate embodiment of a magnetic-field sensor device according to the present invention.

Then, as shown in FIG. 4(d), a top electrode 12 is deposited 44 on top of the insulating layer 13. The top electrode 12 is electrically conducting and may or may not be magnetic, depending on the type of device being fabricated. After this, the structure is patterned 45 and etched 46 so that a region of the insulating layer 13 is recessed and a space 5 between the two electrodes 11, 12 is opened up, as shown in FIG. 4(e).

Figure 4F:
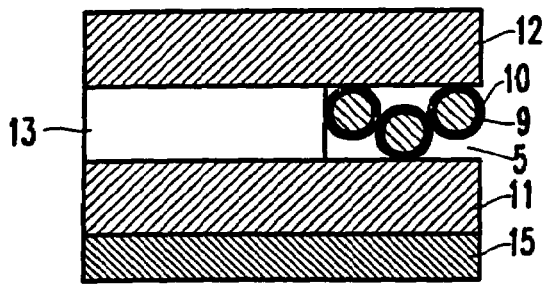
FIG. 4(f) is a side view schematic diagram of an alternate embodiment of a magnetic-field sensor device according to the present invention.
Figure 4G:
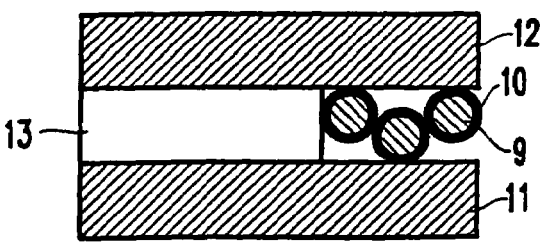
FIG. 4(g) is a side view schematic diagram of an alternate embodiment of a magnetic-field sensor device according to the present invention.
Figure 4H:
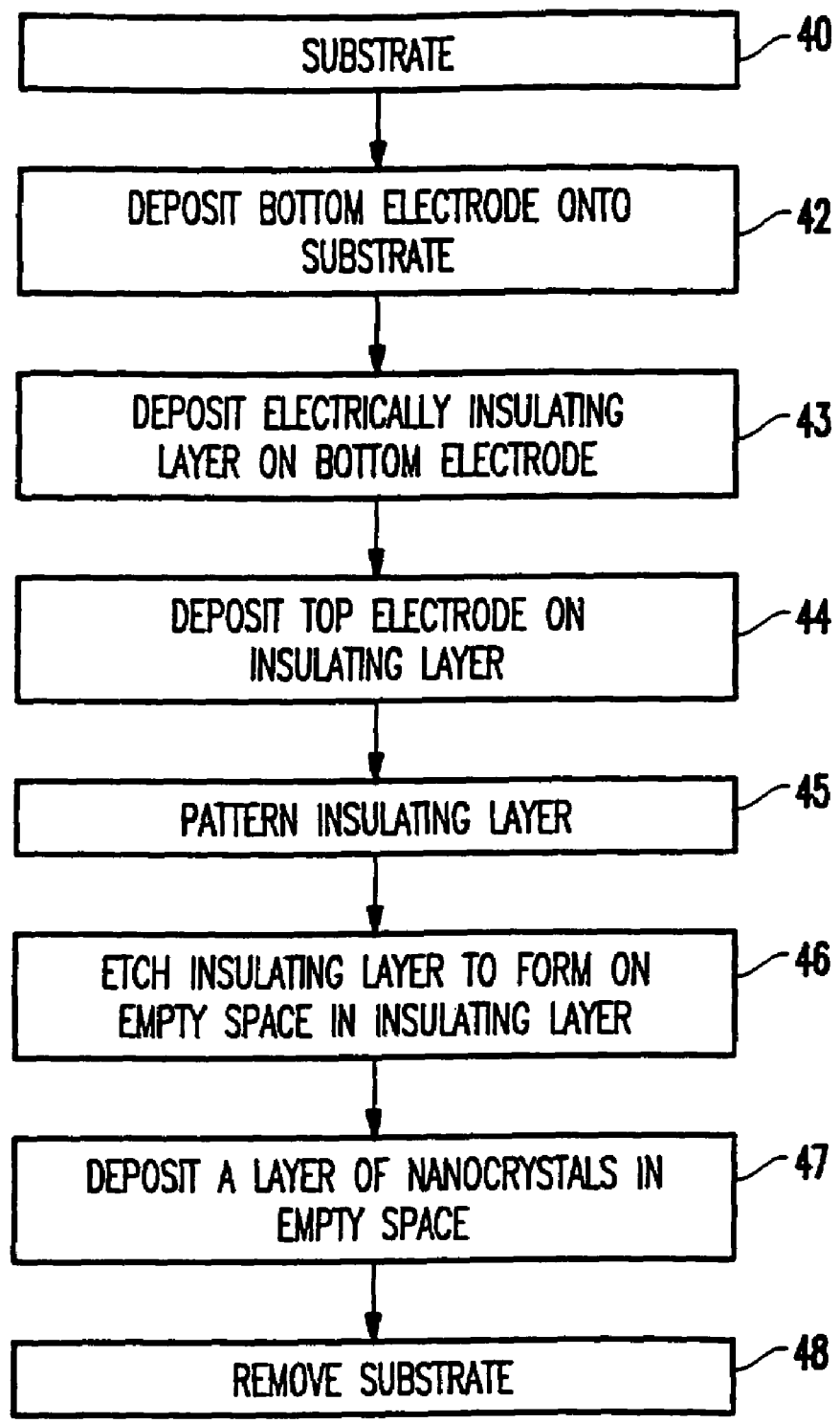
FIG. 4(h) is a flow diagram illustrating an alternate method of the invention as described in FIGS. 4(a) through 4(g)

Next, in FIG. 4(f), a layer of nanoparticles 9 is deposited 47 onto the structure such that the nanoparticles 9 fall in the exposed region 5 between the two electrodes 11, 12. The nanoparticles 9 are separated from each other by an insulating organic layer 10. The nanoparticle layer 9 may be either one or several layers thick, depending on the type of device being fabricated. FIG. 4(f) shows only a single layer of nanoparticles 9 left in the empty space 5. In FIG. 4(g), the substrate 15 is not shown on the device, wherein the substrate 15 may be removed 48, depending on the desired application. Again, the entire process is outlined in FIG. 4(h).

Figure 5A:
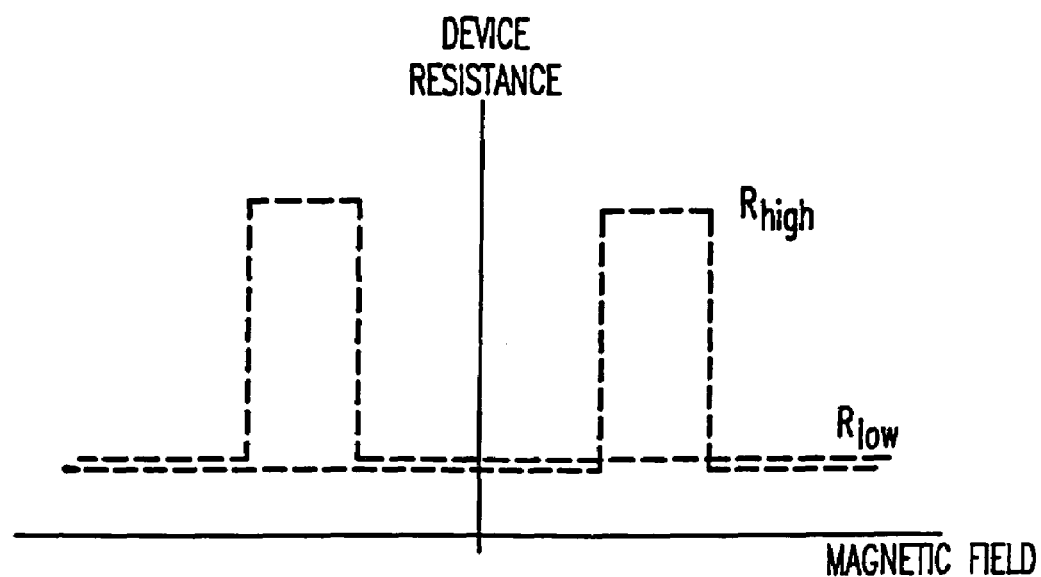
FIG. 5(a) is a plot of the device resistance versus the magnetic field according to the present invention.
Figure 5B:
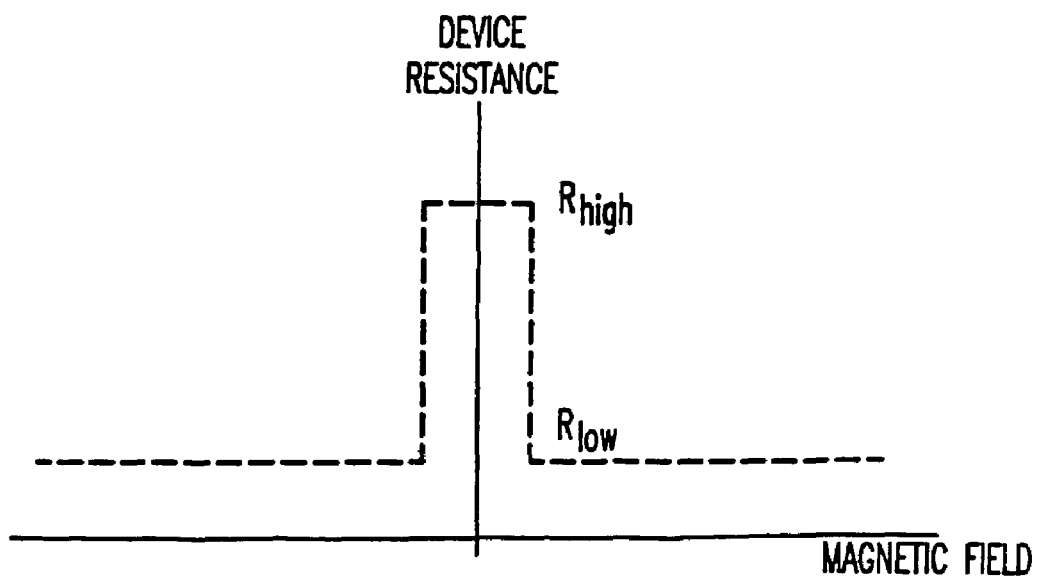
FIG. 5(b) is a plot of the device resistance versus the magnetic field according to the present invention.

The resistance of the device is sensitive to the presence or absence of a magnetic field. FIGS. 5(a) and 5(b) are plots of the device resistance versus the external magnetic field. As shown in FIGS. 5(a) and 5(b), the device resistance can be high ($R_{high}$) or low ($R_{low}$), depending on the amount of the magnetic field which is present. The difference in resistance between the ($R_{high}$) or ($R_{low}$) state is typically between 1% and 50%. The device response to an external field can be made as that which is shown in either FIG. 5(a) or FIG. 5(b), depending on the magnetic properties of the nanoparticles comprising the device. The two different device resistances ($R_{high}$ and $R_{low}$) are used to distinguish the presence of a magnetic field.

The inventive structure (sensor) has several advantages over conventional devices. First, the critical dimension is about 5 to 50 nm and is well-matched to the bit area required for storage at areal densities >10 Gbit/in$^2$. Second, the critical dimension is 5 to 50 nm and is beyond the resolution of current lithographic methods, and is controlled through chemical size separation methods (not through deposition thickness control, and not through lithography). Also, the methods described herein are readily scaled to a large scale production, and the methods use less vacuum-based process equipment than the conventional devices and, hence, the present methods result in lower fabrication costs.

While the invention has been described in terms of preferred embodiments, those skilled in the art will recognize that the invention can be practiced with modification within the spirit and scope of the appended claims.

What is claimed is:

1. A method of forming a magnetic-field sensor device, said method comprising:
    depositing a first electrode onto a substrate;
    depositing an electrically insulating layer on said first electrode;
    removing a portion of said electrically insulating layer to expose a region of said first electrode;
    after said removing of said portion of said electrically insulating layer, depositing a single layer of chemically-synthesized magnetic nanoparticles on said electrically insulating layer and said exposed region of said first electrode, wherein a height of said single layer of chemically-synthesized nanoparticles is equal to a depth of said insulating layer;
    depositing a second electrode on said chemically-synthesized nanoparticles and said electrically insulating layer, wherein said first and second electrodes comprise an electrically conducting and magnetic material and are separated by a distance in said exposed region equal to a thickness of said single layer of chemically-synthesized nanoparticles; and
    orienting said chemically-synthesized magnetic nanoparticles with a magnetic-moment orientation parallel to a direction of a current flow through said chemically-synthesized magnetic nanoparticles,
    wherein said chemically-synthesized nanoparticles each comprise an organic spacer which electrically isolates the nanoparticles from each other and acts as a tunnel barrier for electrons between said first and second electrodes, and
    wherein said electrically insulating layer is deposited on said first electrode to a thickness equal to said height of said single layer of chemically-synthesized nanoparticles.

2. The method according to claim 1, wherein said substrate comprises one of a conducting material and a non-conducting material.

3. The method according to claim 1, further comprising depositing a layer of magnetic material on said substrate.

4. The method according to claim 1, wherein said chemically-synthesized nanoparticles comprise elements comprising one of Co, Fe, Ni, Mn, Cr, Nd, Pr, Pt, Pd, Ho, Gd, Eu, Er, Re, Rh, an intermetallic compound of said elements, a binary alloy of said elements, a ternary alloy of said elements, an oxide comprising one of Fe, Co, Ni, Mn, and Cr, and a mixed oxide combining at least one of Fe, Co, Ni, Mn, and Cr, with at least one of La, Sr, Ba, and Cu.

5. The method according to claim 1, wherein a deviation between diameters of different ones of said nanoparticles is less than 15%.

6. The method according to claim 1, wherein said single layer of chemically-synthesized magnetic nanoparticles comprises one chemically-synthesized magnetic nanoparticle.

7. A method of forming a magnetic-field sensor device, said method comprising:
    depositing a first electrode onto a substrate;
    depositing an electrically insulating layer on said first electrode;
    removing a portion of said electrically insulating layer to expose a region of said first electrode;
    after said removing of said portion of said electrically insulating layer, depositing a single layer of chemically-synthesized magnetic nanoparticles on said electrically insulating layer and said exposed region of said first electrode, wherein a height of said single layer of chemically-synthesized nanoparticles is equal to a depth of said insulating layer;
    depositing a second electrode on said chemically-synthesized nanoparticles and said electrically insulating layer, wherein said first and second electrodes comprise an electrically conducting and magnetic material and are separated by a distance in said exposed region equal to a thickness of said single layer of chemically-synthesized nanoparticles;
    orienting said chemically-synthesized magnetic nanoparticles with a magnetic-moment orientation parallel to a direction of a current flow through said chemically-synthesized magnetic nanoparticles; and removing said substrate, wherein a deviation between diameters of different ones of said nanoparticles is less than 15%, wherein said chemically-synthesized nanoparticles each comprise an organic spacer which electrically isolates the nanoparticles from each other and acts as a tunnel barrier for electrons between said first and second electrodes, and wherein said electrically insulating layer is deposited on said first electrode to a thickness equal to said height of said single layer of chemically-synthesized nanoparticles.

8. The method according to claim 7, wherein said single layer of chemically-synthesized magnetic nanoparticles comprises one chemically-synthesized magnetic nanoparticle.

9. The method according to claim 7, wherein said chemically-synthesized nanoparticles comprise elements comprising one of Co, Fe, Ni, Mn, Cr, Nd, Pr, Pt, Pd, Ho, Gd, Eu, Er, Re, Rh, an intermetallic compound of said elements, a binary alloy of said elements, a ternary alloy of said elements, an oxide comprising one of Fe, Co, Ni, Mn, and Cr, and a mixed oxide combining at least one of Fe, Co, Ni, Mn, and Cr, with at least one of La, Sr, Ba, and Cu.

10. A method of forming a magnetic-field sensor device, said method comprising:

depositing a first electrode onto a substrate;

depositing an electrically insulating layer on said first electrode;

removing a portion of said electrically insulating layer to expose a region of said first electrode;

after said removing of said portion of said electrically insulating layer, depositing a single layer of chemically-synthesized magnetic nanoparticles on said electrically insulating layer and said exposed region of said first electrode, wherein said depositing of said chemically-synthesized nanoparticles comprises depositing chemically-synthesized nanoparticles comprising a maximum diameter of 4.9 nm, and wherein a height of said single layer of chemically-synthesized nanoparticles is equal to a depth of said insulating layer;

depositing a second electrode on said chemically-synthesized nanoparticles and said electrically insulating layer, wherein said first and second electrodes comprise an electrically conducting and magnetic material and are separated by a distance in said exposed region equal to a thickness of said single layer of chemically-synthesized nanoparticles; and orienting said chemically-synthesized magnetic nanoparticles with a magnetic-moment orientation parallel to a direction of a current flow through said chemically-synthesized magnetic nanoparticles, wherein said chemically-synthesized nanoparticles each comprise an organic spacer which electrically isolates the nanoparticles from each other and acts as a tunnel barrier for electrons between said first and second electrodes, and wherein said electrically insulating layer is deposited on said first electrode to a thickness equal to said height of said single layer of chemically-synthesized nanoparticles.

11. The method according to claim 10, wherein said substrate comprises one of a conducting material and a non-conducting material.

12. The method according to claim 10, further comprising depositing a layer of magnetic material on said substrate.

13. The method according to claim 10, wherein said chemically-synthesized nanoparticles comprise elements comprising one of Co, Fe, Ni, Mn, Cr, Nd, Pr, Pt, Pd, Ho, Gd, Eu, Er, Re, Rh, an intermetallic compound of said elements, a binary alloy of said elements, a ternary alloy of said elements, an oxide comprising one of Fe, Co, Ni, Mn, and Cr, and a mixed oxide combining at least one of Fe, Co, Ni, Mn, and Cr, with at least one of La, Sr, Ba, and Cu.

14. The method according to claim 10, wherein a deviation between diameters of different ones of said nanoparticles is less than 15%.

15. The method according to claim 10, wherein said single layer of chemically-synthesized magnetic nanoparticles comprises one chemically-synthesized magnetic nanoparticle.

16. A method of forming a magnetic-field sensor device, said method comprising:

depositing a first electrode onto a substrate;

depositing an electrically insulating layer on said first electrode;

removing a portion of said electrically insulating layer to expose a region of said first electrode;

after said removing of said portion of said electrically insulating layer, depositing a single layer of chemically-synthesized magnetic nanoparticles on said electrically insulating layer and said exposed region of said first electrode, wherein a height of said single layer of chemically-synthesized nanoparticles is equal to a depth of said insulating layer;

depositing a second electrode on said chemically-synthesized nanoparticles and said electrically insulating layer, wherein said first and second electrodes comprise an electrically conducting and magnetic material and are separated by a distance in said exposed region equal to a thickness of said single layer of chemically-synthesized nanoparticles; and orienting said chemically-synthesized magnetic nanoparticles with a magnetic-moment orientation perpendicular to a direction of a current flow through said chemically-synthesized magnetic nanoparticles, wherein said chemically-synthesized nanoparticles each comprise an organic spacer which electrically isolates the nanoparticles from each other and acts as a tunnel barrier for electrons between said first and second electrodes, and wherein said electrically insulating layer is deposited on said first electrode to a thickness equal to said height of said single layer of chemically-synthesized nanoparticles.

* * * * *